United States Patent
Sugiyama et al.

(10) Patent No.: US 10,274,545 B2
(45) Date of Patent: Apr. 30, 2019

(54) CALCULATION APPARATUS AND METHOD FOR CALCULATING RELATIONSHIP BETWEEN CHARGE AMOUNT AND POTENTIAL

(71) Applicant: KABUSHIKI KAISHA TOSHIBA, Tokyo (JP)

(72) Inventors: Nobukatsu Sugiyama, Kanagawa (JP); Ena Ishii, Kanagawa (JP); Tomokazu Morita, Chiba (JP); Mitsunobu Yoshida, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 539 days.

(21) Appl. No.: 14/644,495

(22) Filed: Mar. 11, 2015

(65) Prior Publication Data

US 2015/0268306 A1    Sep. 24, 2015

(30) Foreign Application Priority Data

Mar. 18, 2014    (JP) ................. 2014-055503

(51) Int. Cl.
*G01R 31/36*    (2019.01)
*G01R 31/367*    (2019.01)
*G01R 31/24*    (2006.01)

(52) U.S. Cl.
CPC ............ *G01R 31/367* (2019.01); *G01R 31/24* (2013.01)

(58) Field of Classification Search
CPC ........................ G01R 31/36–31/3696
See application file for complete search history.

(56) References Cited

U.S. PATENT DOCUMENTS

| | | | |
|---|---|---|---|
| 5,739,671 A | 4/1998 | Hamada | |
| 6,608,468 B2 | 8/2003 | Nagase | |
| 2002/0036481 A1 | 3/2002 | Nagase | |
| 2008/0215265 A1 | 9/2008 | Tohyama | |
| 2009/0051321 A1* | 2/2009 | Sato ..................... | B60L 11/123 320/132 |
| 2011/0161025 A1 | 6/2011 | Tomura et al. | |
| 2011/0294020 A1 | 12/2011 | Kim et al. | |
| 2012/0310566 A1* | 12/2012 | Hoshino ............ | G01R 31/3651 702/63 |

(Continued)

FOREIGN PATENT DOCUMENTS

| | | |
|---|---|---|
| CN | 102439782 A | 5/2012 |
| CN | 102983371 A | 3/2013 |

(Continued)

OTHER PUBLICATIONS

"Regression analysis" From Wikipedia, Mar. 15, 2014.*

(Continued)

*Primary Examiner* — Eric A. Ward
(74) *Attorney, Agent, or Firm* — Finnegan, Henderson, Farabow, Garrett & Dunner L.L.P.

(57) ABSTRACT

According to one embodiment, a calculation apparatus includes a calculator. The calculator calculates a relationship between a charge amount and a potential according to an arbitrary initial charge amount based on a relationship between a charge amount and a potential of an electrode of a secondary battery on a charge side and a relationship between a charge amount and a potential of the electrode on a discharge side.

14 Claims, 9 Drawing Sheets

(56) References Cited

U.S. PATENT DOCUMENTS

| | | | | |
|---|---|---|---|---|
| 2013/0076363 A1* | 3/2013 | Takahashi | .......... | G01R 31/3634 324/427 |
| 2013/0317771 A1* | 11/2013 | Laskowsky | ........ | G01R 31/3675 702/63 |
| 2014/0214347 A1* | 7/2014 | Laskowsky | ........ | G01R 31/3624 702/63 |
| 2014/0222358 A1 | 8/2014 | Morita et al. | | |
| 2014/0320141 A1* | 10/2014 | Kaburagi | .............. | H01M 10/48 324/426 |
| 2015/0022158 A1* | 1/2015 | Osawa | .................. | H01M 4/505 320/134 |
| 2015/0028815 A1* | 1/2015 | Osawa | .................. | H01M 10/44 320/134 |
| 2015/0160300 A1 | 6/2015 | Ishii et al. | | |
| 2016/0202324 A1* | 7/2016 | Biletska | ............. | G01R 31/3651 702/63 |
| 2016/0204639 A1* | 7/2016 | Honkura | .............. | H02J 7/0068 429/50 |

FOREIGN PATENT DOCUMENTS

| | | |
|---|---|---|
| EP | 2 530 482 | 12/2012 |
| JP | 2000-078758 | 3/2000 |
| JP | 2009-080093 | 4/2009 |
| JP | 2010-60384 | 3/2010 |
| JP | 2011-075461 | 4/2011 |
| JP | 2012-503293 | 2/2012 |
| JP | 2012-251806 | 12/2012 |
| JP | 2013-19852 A | 1/2013 |
| JP | 2013-105519 | 5/2013 |
| JP | 2013-149586 | 8/2013 |
| JP | 2013-164373 | 8/2013 |
| JP | 2013-213808 | 10/2013 |
| JP | 2013-213809 | 10/2013 |
| JP | 2014-010003 | 1/2014 |
| JP | 2014-190763 | 10/2014 |
| JP | 2015-111086 | 6/2015 |
| JP | 2015-175753 | 10/2015 |
| TW | 515120 | 12/2002 |
| WO | WO 2014/156869 | 10/2014 |

OTHER PUBLICATIONS

Notification of Reason for Refusal, issued by the Korean Intellectual Property Office, in corresponding Application No. 10-2015-0030375, dated Mar. 18, 2016, 9 pages.

Office Action, Issued by the Taiwan Intellectual Property Office, in corresponding Application No. 104107227, dated Jan. 7, 2016, 11 pages.

* cited by examiner

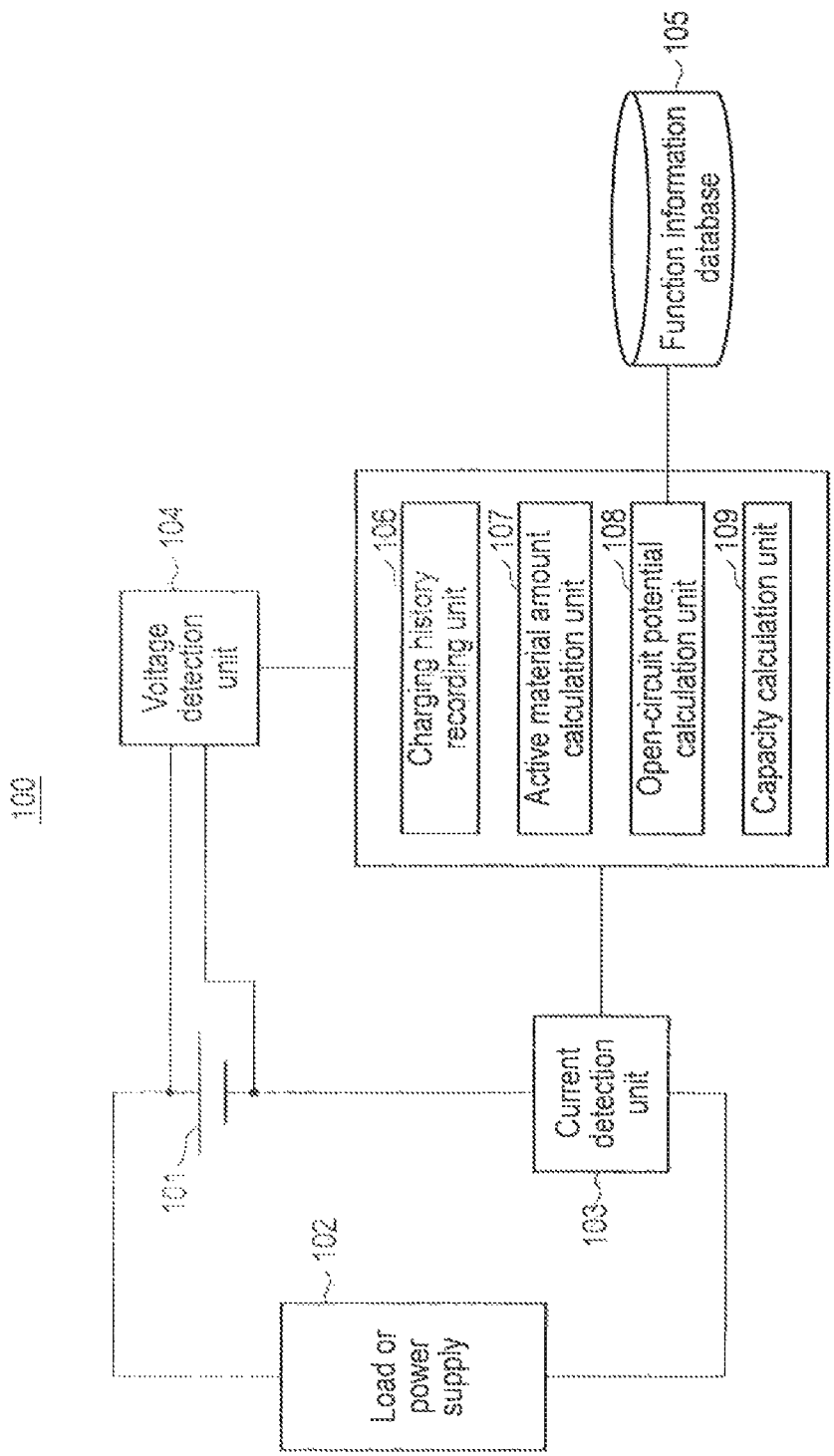
F I G. 1

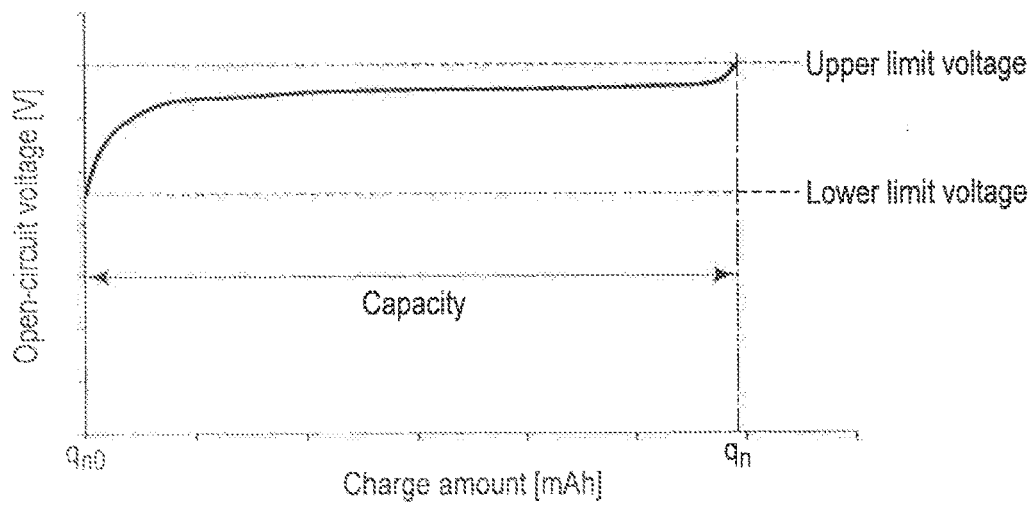
F I G. 10
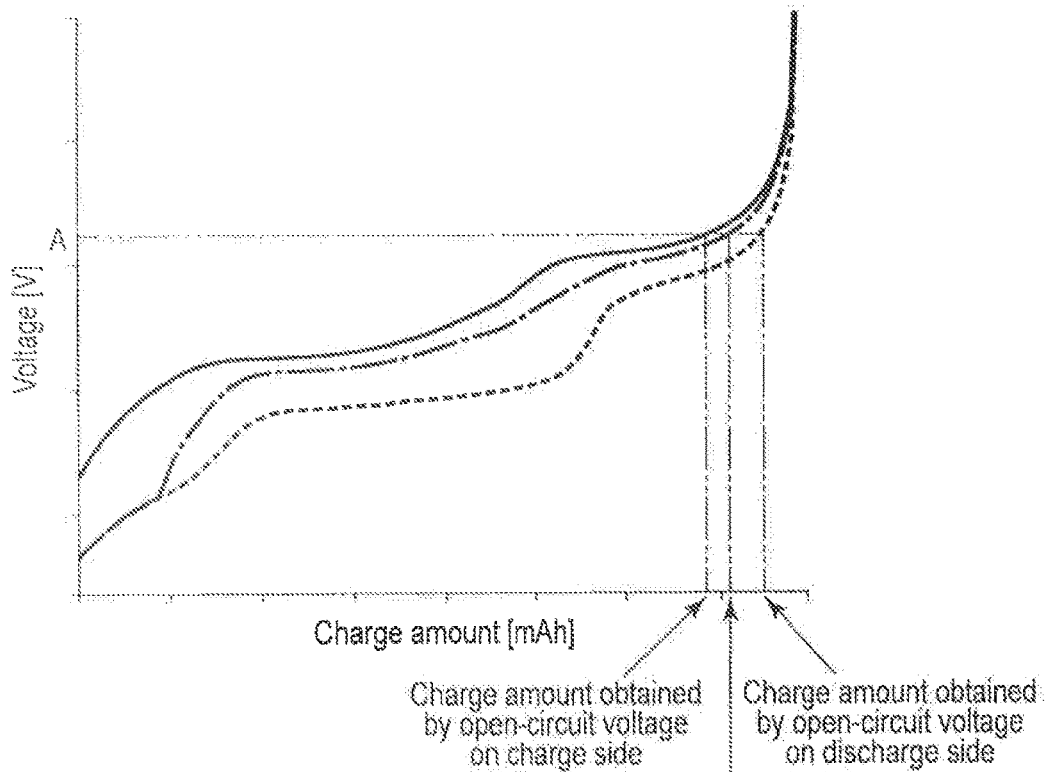
F I G. 11

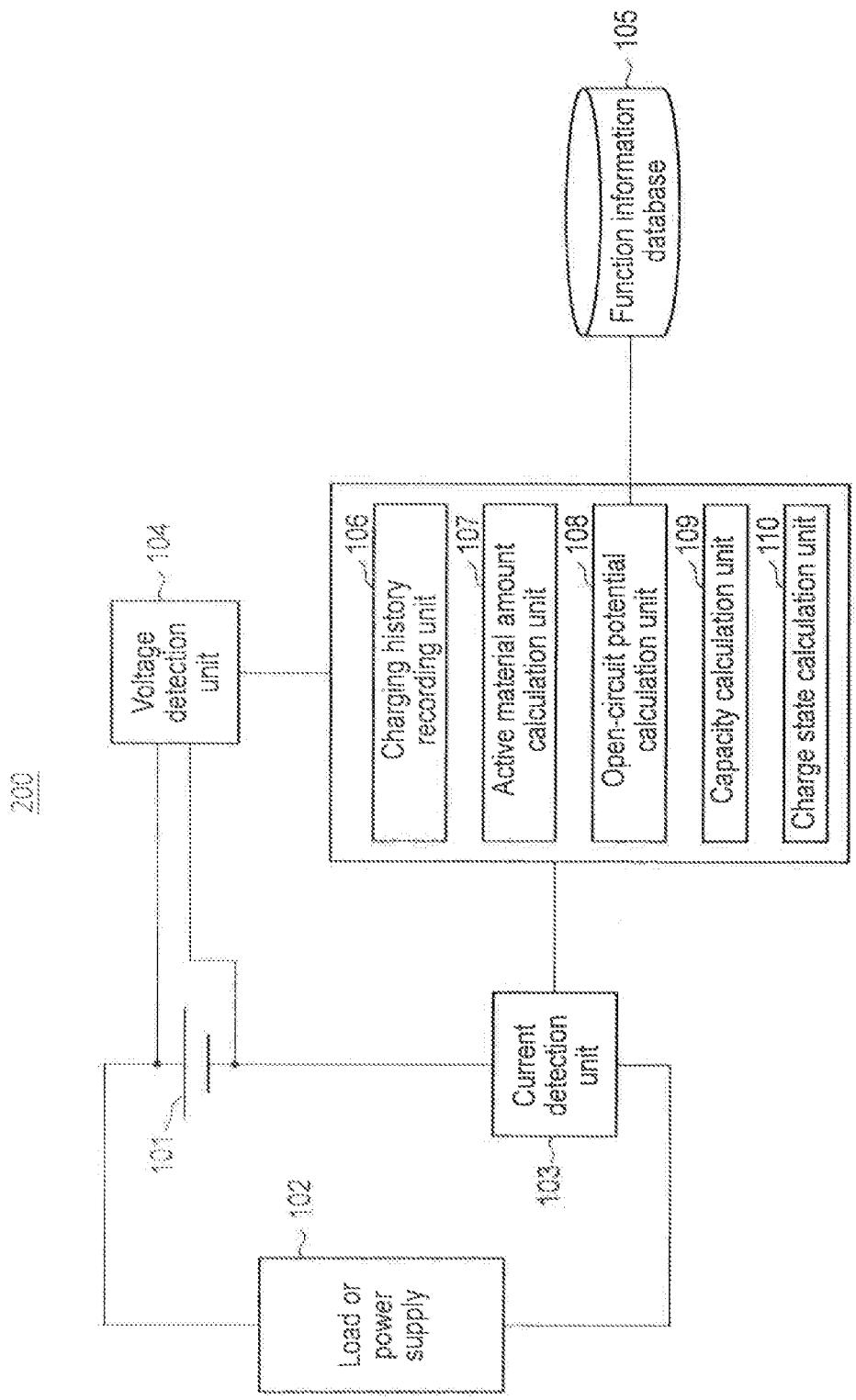
F I G. 12

CALCULATION APPARATUS AND METHOD FOR CALCULATING RELATIONSHIP BETWEEN CHARGE AMOUNT AND POTENTIAL

CROSS REFERENCE TO RELATED APPLICATIONS

This application is based upon and claims the benefit of priority from Japanese Patent Application No. 2014-055503, filed Mar. 18, 2014, the entire contents of which are incorporated herein by reference.

FIELD

Embodiments described herein relate to, for example, a calculation apparatus and calculation, method for calculating the charge state of a secondary battery.

BACKGROUND

To accurately grasp the charge state of a secondary battery, it is important to accurately grasp the open-circuit potential of an electrode of the secondary battery. It is known of the secondary battery that the open-circuit potential of an electrode changes in accordance with the initial charge amount of the electrode at the time when charging or discharging starts. That is, in a calculation apparatus, to accurately grasp the open-circuit potential of an electrode of the secondary battery, a plurality of data must be stored in advance for each of various initial charge amounts. A large storage area must be ensured.

BRIEF DESCRIPTION OF THE DRAWINGS

FIG. 1 is a block diagram showing the arrangement of a calculation apparatus according to the first embodiment;

FIG. 10 is a graph showing an example of a function representing a relationship between the charge amount and open-circuit voltage of the secondary battery in accordance with the relationship between the charge amount and open-circuit potential calculated by an open-circuit potential, calculation unit;

FIG. 11 is a graph showing a state in which the vertical axis of the function shown in FIG. 10 is enlarged and the open-circuit voltage curves on the charge and discharge sides are superimposed;

FIG. 12 is a block diagram showing the arrangement of a calculation apparatus according to the second embodiment.

DETAILED DESCRIPTION

Figure 2:
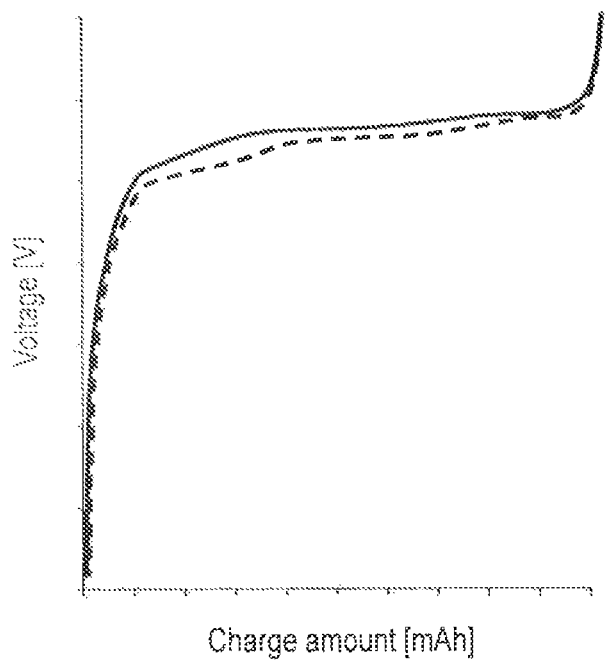
FIG. 2 is a graph showing an example of the open-circuit voltages of a secondary battery.

A calculation apparatus and calculation method according to this embodiment will be described in detail below with reference to the accompanying drawings.

This embodiment is to provide a calculation apparatus and calculation method capable of suppressing an increase in the data storage area and accurately grasping an open-circuit potential regardless of an initial charge amount.

According to one embodiment, a calculation apparatus includes a first calculator. The first calculator calculates a relationship between a charge amount and a potential according to an arbitrary initial charge amount based on a relationship between a charge amount and a potential of an electrode of a secondary battery on a charge side and a relationship between a charge amount and a potential of the electrode on a discharge side.

(First Embodiment)

FIG. 1 is a block diagram showing the arrangement of a secondary battery state calculation apparatus according to the first embodiment. A calculation apparatus 100 shown in FIG. 1 includes a secondary battery 101, a load or power supply 102, a current detection unit 103, a voltage detection unit 104, a function information database 105, a charging history recording unit 106, an active material amount calculation unit 107 (second calculator), an open-circuit potential calculation unit 108 (first calculator), and a capacity calculation unit 109 (third calculator).

The secondary battery 101 is, for example, a secondary battery such as a lithium ion battery. In particular, the secondary battery 101 is a secondary battery having different open-circuit voltages on the charge and discharge sides. Preferably the secondary battery 101 is a secondary battery having characteristics having different open-circuit voltages on the charge and discharge sides because at least one of the cathode material and anode material constituting the secondary battery 101 has different open-circuit potentials on the charge and discharge sides. More specifically, examples of the secondary battery 101 are a lithium ion secondary battery having an anode containing graphite carbon and amorphous carbon made of artificial graphite or natural graphite, and a lithium ion secondary battery including a cathode made of an $Li_2MnO_3$—$Li_xMO_y$ solid solution (M is one of nickel, manganese, cobalt, and iron or a combination of a plurality of these materials). The secondary battery 101 is not limited to these batteries.

The secondary battery 101 may be a battery module such as an assembled battery made of a plurality of battery cells. In this case, the measurement and calculation of various parameters may be performed for each battery cell or for each battery module. In general, since the degradation progress states and characteristics between the plurality of battery cells included in the battery module do not always match each other, the measurement and calculation of various parameters are preferably performed for each battery cell.

The relationship between the charge amount and potential (voltage) on the charge side indicates the relationship representing a change in potential (voltage) with respect to a change in charge amount during charging of the secondary battery, and particularly, the relationship between the charge amount and potential (voltage) which are obtained while charging the secondary battery from the empty state, unless otherwise specified. The relationship between the charge amount and potential (voltage) on the discharge side indicates the relationship of a change in potential (voltage) with respect to a change in charge amount, during discharge of the secondary battery, and particularly, the relationship between the charge amount and potential (voltage) obtained while discharging the secondary battery from the full-charge state, unless otherwise specified. The full-charge state is a state immediately after the secondary battery is charged in accordance with a charging schedule defined for each secondary battery. The empty state indicates a state immediately after the secondary battery is discharged in accordance with a discharging schedule defined for each secondary battery. For example, the defined charging schedule indicates CCCV (Constant Current Constant Voltage) charging in which a constant current value and a constant voltage value are determined so that, for example, the secondary battery is charged at the constant current until the voltage reaches 4 V at 1 A and then charged at the constant current until the current reaches 0.1 A at 4 V. The defined discharging indicates CC (Constant Current) discharging in which a constant current value and a stop voltage are determined so that the secondary battery is discharged at the constant current until the voltage reaches 2 V at 1 A. In this case, predischarging or precharging is performed to make the secondary battery close to near the empty state or full-charge state. After that, charging or discharging is preferably performed in accordance with the defined charging schedule or the defined discharging schedule.

FIG. 2 shows an example of the relationship between the charge amount and voltage of the secondary battery. The charge amount [mAh] is plotted along the horizontal axis, and the voltage [V] is plotted along the vertical axis. Referring to FIG. 2, a solid line indicates the relationship between the charge amount and voltage when obtaining the open-circuit voltage while charging the secondary battery from the empty state. A broken line indicates the relationship between the charge amount and voltage when obtaining the open-circuit voltage while discharging the secondary battery from, the full-charge state.

The load or power supply 102 is connected to the secondary battery 101 and is a load which consumes power or a power supply which supplies power.

The current detection unit 103 detects a current flowing through the secondary battery 101.

The voltage detection unit 104 detects a voltage between the cathode terminal and the anode terminal of the secondary battery 101.

Functions (for example, functions in FIGS. 3 and 4) representing the relationships between the charge amounts and potentials of an active material forming each electrode of the secondary battery 101 are recorded in the function information database 105. These functions may be stored in the form such as a table, values, or a look-up table. More specifically, the functions indicate open-circuit potential curves or may use changes in charged or discharged voltages at a low rate (for example, 0.2 C rate or less). When an active material has different relationships between the charge amounts and potentials on the discharge and charge sides, the database stores, for one active material, a function representing a relationship between the charge amount and potential on the charge side when the secondary battery is charged from at least the empty state and a function representing a relationship between the charge amount and potential on the discharge side when the secondary battery is discharged, from the full-charge state. A plurality of functions representing the relationships between, the charge amounts and potentials on the charge side may be recorded in the database in accordance with the charge amount at the start time of charging. A plurality of functions representing the relationships between the charge amounts and potentials on the discharge side may be recorded in the database in accordance with the charge amount at the start time of discharging. The number of functions is preferably small in order to reduce the recording area.

Figure 3:
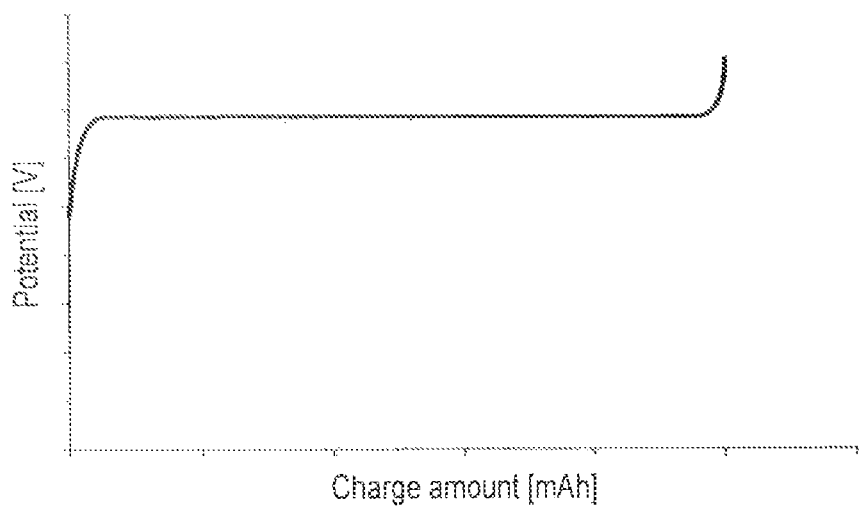
FIG. 3 is a graph showing a function which, describes a relationship between the charge amount and potential of a cathode active material.
Figure 4:
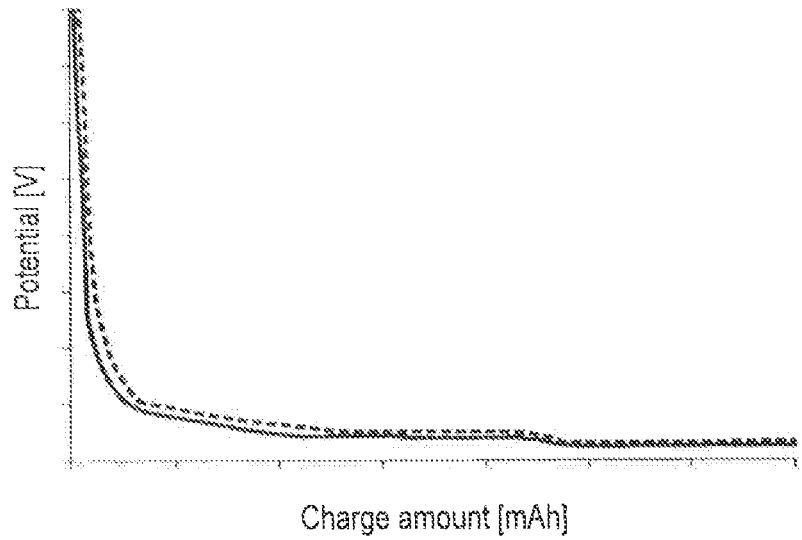
FIG. 4 is a graph showing a function which describes relationships between the charge amounts and potentials of an anode active material.

FIGS. 3 and 4 show examples of a function representing the relationships between the charge amounts and potentials of the cathode and anode active materials. FIG. 3 shows a cathode function, and the relationship between the charge amount and potential on the charge side is the same as that on the discharge side. FIG. 4 shows an anode function, and the relationship between the charge amount and potential on the charge side is different from that on the discharge side. A solid line indicates the relationship between the charge amount and potential on the charge side (when assembled as a battery). A broken line indicates the relationship between the charge amount and potential on the discharge side (when assembled as a battery).

The charging history recording unit 106, the active material amount calculation unit 107, the open-circuit potential calculation unit 108, and the capacity calculation unit 109 are formed from a combination of an arithmetic unit such as a CPU (Central Processing Unit) or MCU (Micro Control Unit) and memory units such a RAM (Random Access Memory) and ROM (Read Only Memory).

The charging history recording unit 106 records a current detected by the current detection unit 103 and a voltage detected by the voltage detection unit 104 at the time of charging or discharging.

Figure 5:
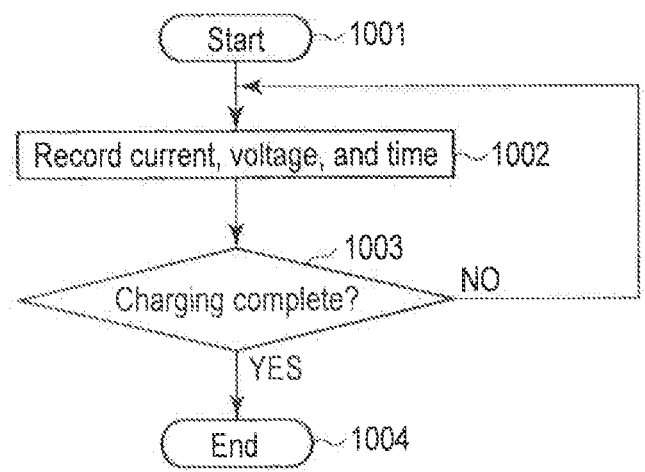
FIG. 5 is a flowchart showing processing of a charging history recording unit.

FIG. 5 shows the sequence of processing of the charging history recording unit 106. The charging history recording unit 106 starts processing from, step 1001 when charging of the secondary battery 101 is started. The charging history recording unit 106 repeatedly executes processing in step 1002 shown in FIG. 5 at every predetermined time interval. The time interval can be arbitrarily set and is preferably set in the range of, for example, about 0.1 sec to 1 sec.

The charging history recording unit 106 starts processing from step 1001 and records the current, voltage, and time in step 1002. In this case, the time may be an absolute time or any of relative times after the start of charging. When processing of the charging history recording unit 106 is repeatedly executed at every predetermined time interval, time recording can be omitted. When charging of the secondary battery 101 ends in step 1003, processing in step 1004 ends.

Figure 6:
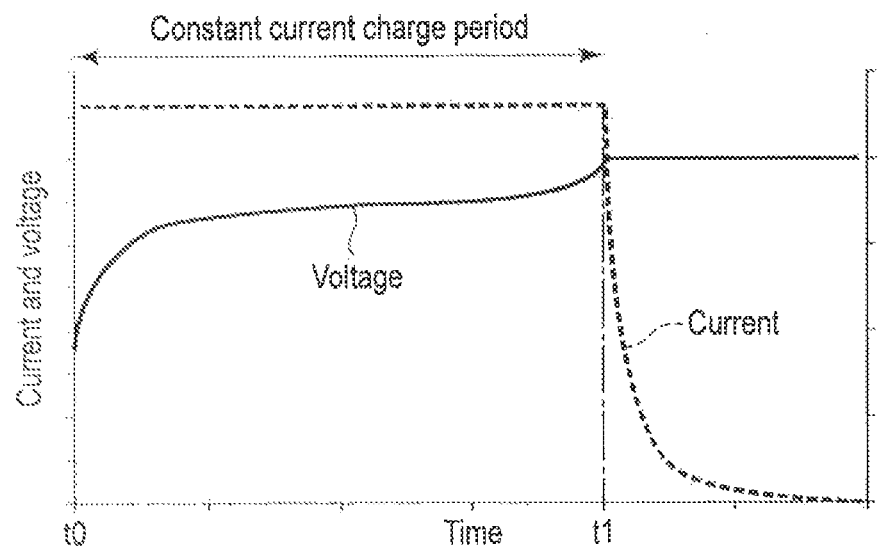
FIG. 6 is a graph showing an example of current and voltage histories at the time of charging.

FIG. 6 shows an example of current and voltage histories during charging. A broken line in FIG. 6 indicates the current history, while a solid line indicates the voltage history. The charging history shown in FIG. 6 is an example of CCCV charging generally used as the charging method of the secondary battery.

In the processing of the active material amount calculation unit 107 of this embodiment, for example, only the charging history of the overall CCCV charging or the charging history during a CC charging period (that is, the period from t0 to t1 in FIG. 6) can be used.

The active material amount calculation unit 107 performs regression analysis from, the charging history recorded in the charging history recording unit 106 using a function (fc) representing the relationship between the charge amount and potential of the cathode calculated by the open-circuit potential calculation unit 108 and a function (fa) representing the relationship between the charge amount and potential of the anode, which, changes by the initial charge amount of the anode, thereby calculating the mass of the cathode (particularly the cathode active material) and the mass of the anode (particularly the anode active material).

More particularly, the active material amount calculation unit 107 calculates the mass of the cathode (particularly the cathode active material), the mass of the anode (particularly the anode active material), the initial charge amount of the cathode, the initial charge amount of the anode, and the internal resistance value of the secondary battery 101. Note that for descriptive simplicity, it is assumed that each of the cathode and the anode is made of one kind of active material. However, this embodiment is also applicable to a cathode and anode each made of a plurality of active materials. For descriptive simplicity, differences in relationship between the charge amounts and potentials on the charge and discharge sides are assumed to exist, for the anode material. However, this embodiment is also applicable to a case in which only the cathode material has characteristics indicating differences in relationship between the charge amounts and potentials on the charge and discharge sides, or both the cathode and anode materials have characteristics indicating differences in relationships between, the charge amounts and potentials on the charge and discharge sides.

When charging a secondary battery 101 made of a cathode and anode, each made of one kind, of active material, a terminal voltage VI of the secondary battery 101 at time t is expressed by:

$$V_t = f_c\left(q_0^c + \frac{q_t}{M_c}\right) - f_a\left(q_0^a + \frac{q_t}{M_a}, q_0^q\right) + RI_t \quad (1)$$

$I_t$: the current value at time t
$q_t$: the charge amount of the battery at time t
$f_c$: the function representing the relationship between the charge amount and potential of the cathode
$f_a$: the function representing the relationship between, the charge amount and potential of anode, which is changed by the initial charge amount of the anode
$q_0^c$: the initial charge amount of the cathode
$M_c$: the mass of the cathode
$q_0^a$: the initial charge amount of the anode
$M_a$: the mass of the anode
R: the internal resistance In this case, the current value at time t is the detection value of the current detection unit 103, which is stored in the charging history recording unit 106. The charge amount of the battery at time t can be calculated by time-integrating the current values. The open-circuit potential calculation unit 108 calculates the function (FIG. 3) representing the relationship between the charge amount and potential of the cathode and the function (FIG. 4) representing the relationship between the charge amount and potential of the anode, which is changed by the initial charge amount of the anode.

The active material amount calculation unit 107 performs regression analysis (to foe described later) to reduce the residue between the terminal voltage value of the secondary battery 101 which is stored in association with a predetermined measurement time in the charging history recording unit 106 and the terminal voltage value calculated by equation (1), thereby calculating a parameter set. The active material amount calculation unit 107 may calculate a parameter set which minimizes a residue E of an SSD (Sum of Squared Difference) indicated by, for example:

$$E = \sum_{t=t_{start}}^{t_{end}} \left(V_{bat\_t} - \left(f_c\left(q_0^c + \frac{q_t}{M_c}\right) - f_a\left(q_0^a + \frac{q_t}{M_a}, q_0^q\right) + RI_t\right)\right)^2 \quad (2)$$

$V_{bat\_t}$: the terminal voltage at time t
$t_{start}$: the measurement time corresponding to the start point of the period as the regression analysis target
$t_{end}$: the measurement time corresponding to the end point of the period Note that the period as the regression analysis target preferably corresponds to the CC charging period or CC discharging period from the viewpoint of suppressing an adverse influence of errors in the measurement value (for example, an error in a parameter which can be calculated). However, the period as the regression analysis target may correspond to another period.

The active material amount calculation unit 107 can use various kinds of algorithms to calculate a parameter set which minimizes the residue. For example, a first-order differentiation such as the Gauss-Newton method or the Levenberg-Marquardt method may be used to calculate a parameter set. Alternatively, the parameter set may be calculated using a metaheuristic algorithm such as particle swarm optimization or a generic algorithm.

By using the function information database 105 and the initial charge amount of the cathode or anode, the open-circuit potential calculation unit 108 calculates the relationship between the potential and charge amount of the cathode or anode, which is changed by the initial charge amount. That is, the open-circuit potential calculation unit 108 can calculate the relationship between the charge amount and potential corresponding to an arbitrary initial charge amount based on the relationship between the charge amount and the potential on the charge side of the electrode included in the secondary battery and the relationship between the charge amount and potential on the discharge side of the electrode.

When an active material in which the relationship between the charge amount, and potential on the charge side is the same as that on the discharge side is used, or the function information data base 105 stores one relationship between the charge amount and potential for one active material, the open-circuit potential calculation unit 108 calculates a potential (open-circuit potential) corresponding to the charge amount with reference to the function information database 105. The open-circuit potential here includes a voltage obtained when the secondary battery is charged or discharged at a low rate (for example, 0.2 C rate or less).

An active material having differences in relationships between, the charge amounts and potentials on the charge and discharge sides will now be described, below. Note that for descriptive simplicity, in the following description, the function information database 105 stores functions representing relationships between charge amounts and potentials on the charge and discharge sides. For example, referring to FIG. 4, when the active material is charged not from the empty state, but from an intermediate state, the relationship between the charge amount and potential changes in accordance with the charging start state. This potential is higher than a potential (the solid line in FIG. 4) on the charge side, which reaches a given charge amount after the active material is charged from the empty state (the potential is low when it is observed as the voltage of the secondary battery), and is lower than a potential (the broken line in FIG. 4), which reaches the given charge amount after the active material is discharged from, the full-charge state (the potential, is high when it is observed as the voltage of the secondary battery).

Since the potential obtained when charging is started from the intermediate state is located between the charge potential and the discharge potential, this potential can be expressed using a ratio of the potential at the time of charging to the potential at the time of discharging.

(Potential obtained when charging is started from intermediate state)=$k\times$(potential at time of charging)+$(1-k)\times$(potential at time of discharging)

where k satisfies $0 \leq k \leq 1$ and is expressed as a function depending on the charge state at the start time of charging. This makes it possible to very easily calculate a potential for each charge state at the start time of charging. A value representing the charge amount or a value obtained by normalizing the charge with the default full-charge amount can be used as the charge state. An example of a function of deriving k will be described below.

(Function Example 1)

Letting Qs be the charge state at the start time of charging of the anode, a ratio k(Q) of the potential, at the time of charging to the potential, at the time of discharging in the charge state Q is given by:

$$k(Q) = \begin{cases} \frac{1-Q_s}{Q_l}(Q-Q_s) & (Q < Q_s + Q_l) \\ 1-Q_s & (Q \geq Q_s + Q_l) \end{cases} \quad (3A)$$

where Ql is a constant expressing a rate of changing the potential at the time of discharging to the potential at the time of charging. Q and Qs satisfy $0 \leq Q \leq 1$ and $0 \leq Qs \leq 1$.

Figure 7:
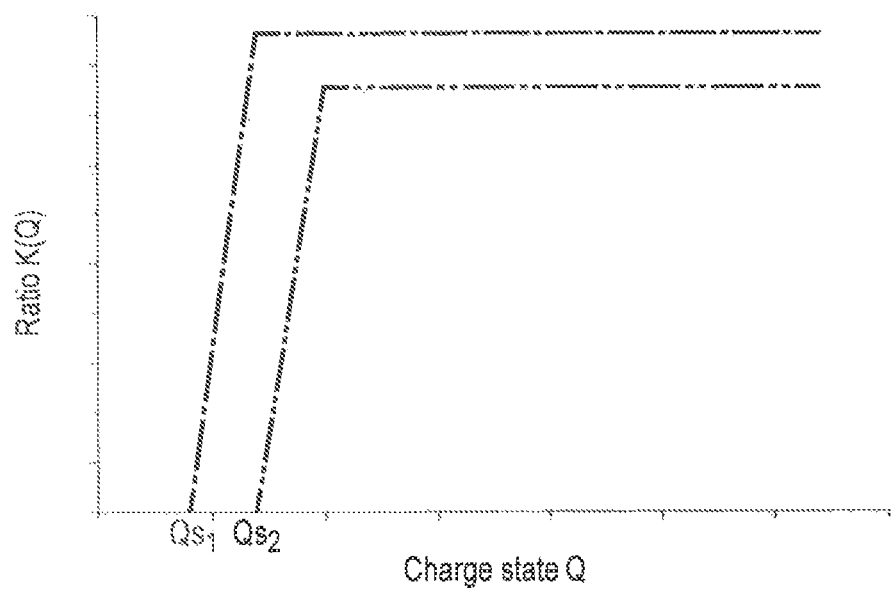
FIG. 7 is a graph showing an example of ratios of charging potentials and discharging potentials which are represented, by equation (3A)

FIG. 7 shows an example of the ratio k(Q) of the potential at the time of charging to the potential at the time of discharging, which is expressed by equation (3A). An alternate long and short dashed line in FIG. 7 indicates a ratio k(Q) obtained when the charge state at the start time of charging is given as $Qs_1$. An alternate long and two short dashed line indicates a ratio k(Q) obtained when the charge state at the start time of charging is given as $Qs_2$, which is larger than $Qs_1$.

Figure 8:
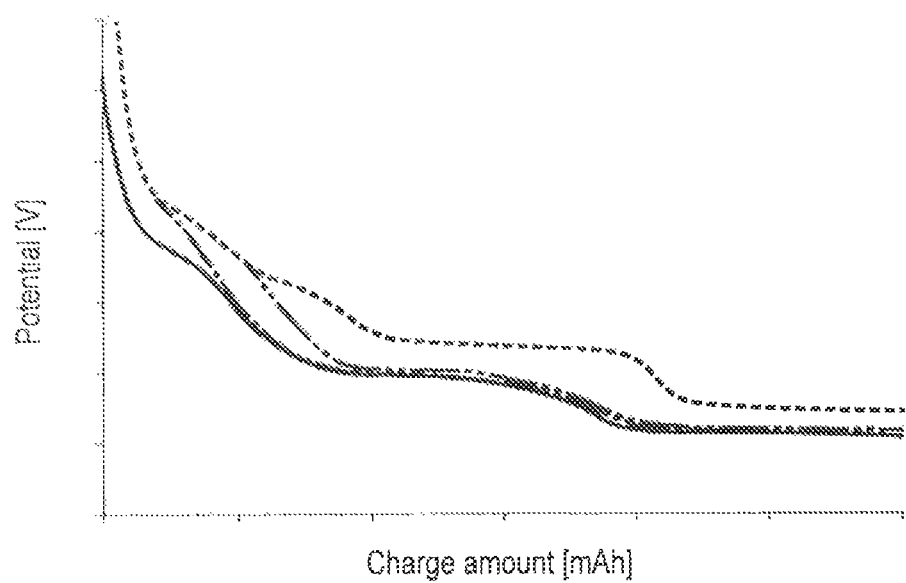
FIG. 8 is a graph showing the function describing the relationships between the charge amounts and potentials of the anode active material and the relationships between the charge amounts and potentials of the anode active materials which are calculated using the ratios in FIG. 7.
Figure 9:
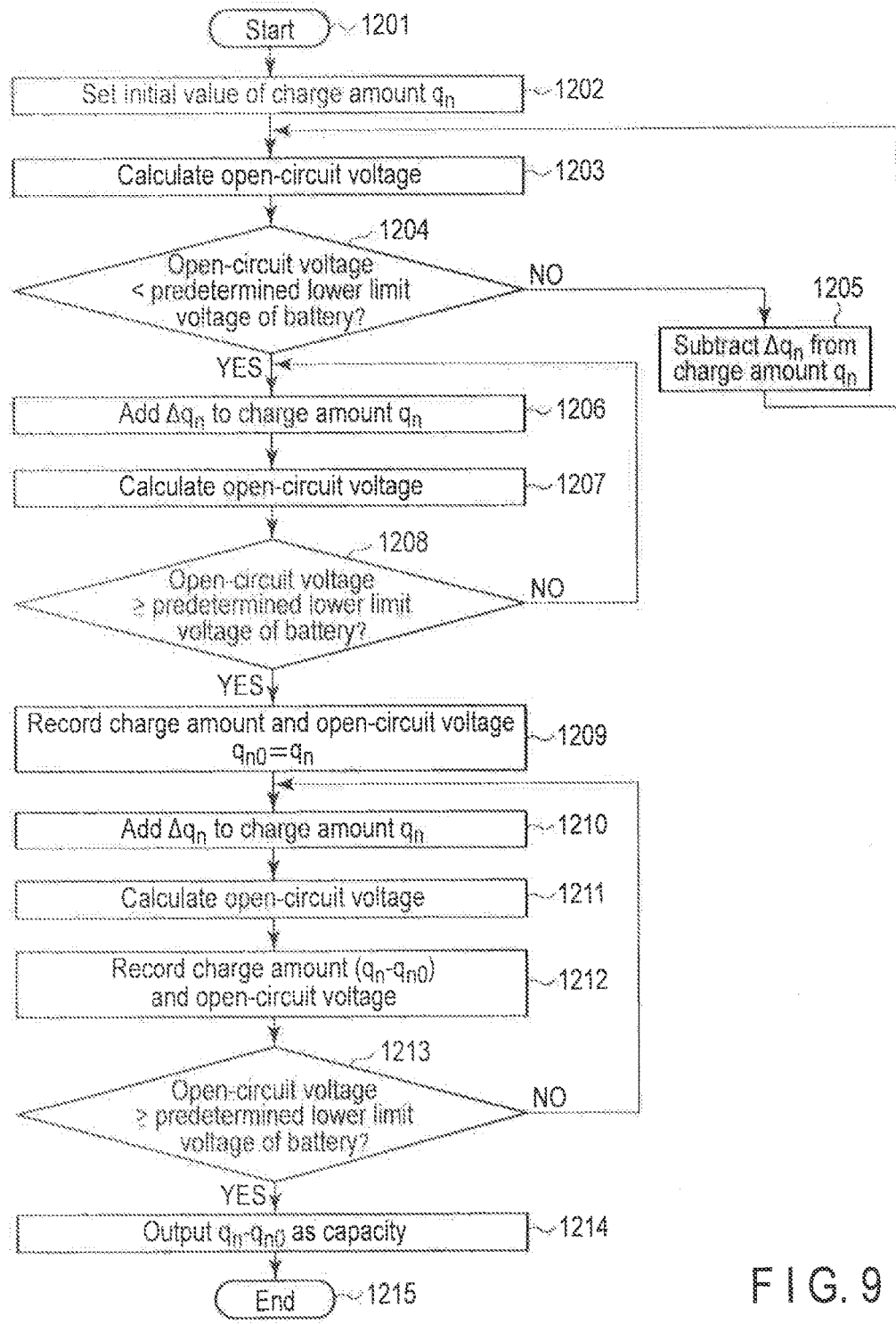
FIG. 9 is a flowchart showing processing of a capacity calculation, unit.

FIG. 8 shows the relationship between the charge amount and potential calculated by the ratio k(Q) of FIG. 7 using the relationships between the charge amounts and potentials of the anode active material on the charge and discharge sides shown in FIG. 4. Referring to FIG. 8, a solid line indicates the relationship between the charge amount and potential on the charge side. A broken line indicates the relationship between the charge amount and potential on the discharge side. An alternate long and short dashed line and an alternate long and two short dashed line correspond to graphs when the charge states at the start time of charging in FIG. 7 are given as $Qs_1$ and $Qs_2$, respectively.

(Function Example 2)

Function example 2 expresses k(Q) as a logarithmic function of Q, as given by:

$$k(Q) = a\log(Q-b) + c \quad (3B)$$

$$a = \begin{cases} Q_s & (Q_s < 0.5) \\ -Q_s + 1 & (Q_s \geq 0.5) \end{cases}$$

$$b = Q_s$$

$$c = 0.5Q_s + 1$$

(the gradient and intercept are merely examples and may be different from the above values).

(Function Example 3)

Function example 3 expresses k(Q) as an approximate pattern of two linear functions, as given by:

$$k(Q) = \begin{cases} \frac{1-Q_s}{Q_l}(Q-Q_s) & (Q < Q_s + Q_l) \\ \frac{Q_s}{1-(Q_s+Q_l)}(Q-1) + 1 & (Q \geq Q_s + Q_l) \end{cases} \quad (3C)$$

(the gradient and intercept are merely examples and may be different from the above values).

(Function Example 4)

Function example 4 expresses k(Q) as a divided ellipse, as given by:

$$k(Q) = \begin{cases} \sqrt{1 - \frac{(x-a)^2}{(a-Q_s)^2}} & (Q < a) \\ 1 & (Q \geq a) \end{cases} \quad (3)$$

$$a = \begin{cases} b_1 & (Q_s < b_1 - c) \\ b_2 & (b_1 - c \leq Q_s < b_2 - c) \\ 1 & (b_2 - c \leq Q_s) \end{cases}$$

for example, b1=0.3; b2=0.7; c=0.05;

More specifically, k(Q) is a monotonically nondecreasing function for Q and has a characteristic starting from near 0 and coming close to 1, k(Q) also has a characteristic in which the gradient gradually decreases as Q becomes larger. Referring to FIG. 7, the gradient is large when the range of Qs is small. However, the gradient is 0 when the range of Qs is large.

This embodiment has described the calculation of the relationship between the charge amount and potential on the charging side, which is changed by the charge state at the start time of charging. To calculate the relationship between the charge amount and potential on the discharge side, which is changed by the charge state at the start time of discharging, k(Q) is set at the potential=$k\times$(potential at time of discharging)+$(1-k)\times$(potential at time of charging) obtained when discharging is started from the intermediate state, and the charge state at the start time of charging is set as the charge state at the start time of discharging. The function k(Q) may be the same on the charge and discharge sides. It is preferable to set different functions if the characteristics are different on the charge and discharge side.

The capacity calculation unit 109 calculates the open-circuit voltage of the battery and the capacity of the battery using the active material amount of the cathode, the active material amount of the anode, the initial charge amount of the cathode, and the initial charge amount of the anode, all of which are calculated by the active material amount calculation unit 107.

Processing of the capacity calculation unit 109 will be described in detail with reference to FIG. 3.

The capacity calculation unit 109 starts processing from step 1201 after processing of the active material amount calculation unit 107 is complete.

In step 1202, the capacity calculation unit 109 sets the initial value of a charge amount $q_n$. Although the initial value of the charge amount $q_n$ can be set to an arbitrary value, it may be calculated from the cathode or anode initial charge value and the active material amount calculated by the active material amount calculation unit 107. More specifically, when the initial charge amount, is 10 mAh/g and the active material amount is 10 g, it is preferable to set the charge amount $q_n$ to about −100 mAh.

In step 1203, the capacity calculation unit 109 calculates an open-circuit, voltage. Equation (4) can be preferably used to calculate the open-circuit voltage as follows:

$$E_n = f_c\left(q_0^c + \frac{q_n}{M_c}\right) - f_o\left(q_0^a + \frac{q_n}{M_c}, q_0^{\prime a}\right) \quad (4)$$

$q_0^{\prime a}$: a desired initial charge amount

More specifically, the desired initial charge amount is obtained such that the open-circuit potential calculation unit 108 calculates the open-circuit potential when the desired initial charge amount is set to 0 and charging starts from the empty state, thereby calculating the open-circuit voltage of the battery. Note that the open-circuit voltage of the secondary battery may be calculated as needed when the desired, initial charge amount is set to an arbitrary value or has a relationship between the charge amount and potential at the time of discharging.

In step 1204, the capacity calculation unit 109 compares the open-circuit voltage calculated in step 1203 with a predetermined lower limit voltage of the battery. The lower limit voltage of the battery is determined by a combination of cathode and anode active materials used in the secondary battery 101. More specifically, an appropriate use range voltage is determined from the viewpoints of safety, service life, resistance, and the like of each of the cathode and anode active materials, and the lower and upper limit voltages of the use range as the battery are determined by the combination. If the open-circuit voltage is lower than the predetermined lower limit voltage, the process advances to step 1206; otherwise, the process advances to step 1205.

In step 1205, $\Delta q_n$ is subtracted from the charge amount $q_n$. In this case, $\Delta q_n$ can be set to an arbitrary value, but is preferably set to about 1/1000 to 1/100 the nominal capacity of the secondary battery 101. More specifically, when the nominal, capacity of the secondary battery 101 is 1000 mAh, $\Delta q_n$ is preferably set to fall within, the range of about 1 mAh to 10 mAh.

In step 1206, the capacity calculation unit 109 adds $\Delta q_n$ to the charge amount $q_n$, and the process advances to step 1207 to calculate the open-circuit voltage using equation (4). In step 1208, the capacity calculation unit 109 compares the open-circuit voltage calculated in step 1207 with the predetermined lower limit voltage of the battery. If the open-circuit voltage is lower than the predetermined lower limit voltage, the process advances to step 1206; otherwise, the process advances to step 1209.

When the process advances to step 1209, $q_n$ by which the open-circuit voltage just exceeds the predetermined lower limit voltage is obtained. In step 1209, the capacity calculation unit 109 records the charge amount as 0 together with an open-circuit voltage $E_t$ calculated in step 1207. The charge amount $q_n$ obtained at this time is defined as $q_{n0}$.

In step 1210, the capacity calculation unit 109 adds $\Delta q_n$ to the charge amount $q_n$. In step 1211, the capacity calculation unit 109 calculates the open-circuit voltage using equation (4). The process then advances to step 1212.

In step 1212, the capacity calculation unit 109 records a value obtained by subtracting $q_{n0}$ from the charge amount $q_n$ and the open-circuit voltage $E_t$ calculated in step 1211. The process then advances to step 1213.

In step 1213, the capacity calculation unit 109 compares the open-circuit voltage calculated in step 1211 with the predetermined upper limit voltage of the battery. The upper limit voltage of the battery is determined by a combination of the cathode and anode active materials used in the secondary battery 101. If the open-circuit voltage is lower than the predetermined upper limit voltage, the process advances to step 1210; otherwise, the process advances to step 1214.

In step 1214, the capacity calculation unit 109 calculates a difference $q_n - q_{n0}$ between the charge amount an at which the open-circuit voltage exceeds the predetermined upper limit voltage of the battery and the charge amount $q_{n0}$ at which the open-circuit voltage exceeds the predetermined lower limit voltage of the battery. The capacity calculation unit 109 outputs the difference as the capacity (full-charge capacity) of the battery. Processing ends in step 1215.

FIG. 10 shows an example of the function representing the relationship between the charge amount and open-circuit voltage, which is calculated by the capacity calculation unit 109. FIG. 11 is a graph in which the vertical axis of the function shown in FIG. 10 is enlarged, and the curves of the open-circuit, voltages on one charge and discharge sides are overlapped and displayed. Referring to FIG. 11, an alternate long and short dashed, line indicates the function representing the relationship between, the charge amount and open-circuit voltage, which is calculated by the capacity calculation unit 109. In addition, a solid line in FIG. 11 indicates the function (the open-circuit voltage on the charging side) representing the relationship between the charge amount and voltage when obtaining the open-circuit voltage while charging is performed from the empty state. A broken line in FIG. 11 indicates the function (the open-circuit voltage on the discharge side) representing the relationship between the charge amount and voltage when obtaining the open-circuit voltage while discharging is performed, from the full-charge state.

Referring to FIG. 11, the anode has different relationships between the charge amounts and potentials on the charge and discharge sides. For this reason, for example, when the charge amount is estimated from the voltage based on the open-circuit voltage, and the measured voltage is given as A, the charge amount obtained by the open-circuit voltage (the solid line in FIG. 11) on the charge side obviously has a difference from the charge amount obtained by the open-circuit voltage (the broken line in FIG. 11) on the discharge side. The open-circuit potential calculation unit 108 of the first embodiment can accurately obtain the open-circuit voltage (the alternate long and short dashed line in FIG. 11) when the active material is charged, or discharged not from the empty state but from the intermediate state, thereby accurately calculating the charge amount and the capacity.

According to the first embodiment, therefore, an increase in data storage area can be suppressed, and an accurate open-circuit potential can be grasped regardless of the initial charge amount. Accordingly, the capacity, the charge state (SOC), and the like of the secondary battery can be accurately estimated. The function representing the relationship between the charge amount and voltage when the open-circuit voltage is obtained while charging is performed from the empty state and the function representing the relationship between the charge amount, and voltage when the open-circuit voltage is obtained while discharging is performed from the full-charge state are measured and stored in advance. Therefore, the function representing the relationship between the charge amount and the open-circuit voltage for an arbitrary initial charge amount can be easily obtained from a predetermined function and the like, thereby further reducing the storage area.

This embodiment has described the open-circuit voltage calculation and capacity calculation at the time of charging in accordance with the change in voltage at the time of charging. It is also possible to perform open-circuit voltage calculation and the capacity calculation at the time of discharging by expressing, using a function, the relationship between the charge amount and potential at the time of discharging, which is changed by the initial charge amount.

(Second Embodiment)

FIG. 12 is a block diagram showing the arrangement of a calculation apparatus according to the second embodiment. A calculation apparatus 200 shown in FIG. 12 includes a secondary battery 101, a load or power supply 102, a current detection unit 103, a voltage detection unit 104, a function information database 105, a charging history recording unit 106, an active material amount calculation unit 107, an open-circuit potential calculation unit 108, a capacity calculation unit 109, and a charge state calculation unit 110.

Note that, of the calculation apparatus 200, portions denoted by the same reference numerals as in FIG. 1 of the first embodiment represent the same parts, and a detailed description thereof will be omitted.

The charge state calculation unit 110, which is different from the arrangement of the first embodiment, will mainly be described below.

The charge state calculation unit 110 calculates the charge state of the secondary battery 101 using a mass and initial, charge amount of a cathode and a mass and initial charge amount of an anode, which are obtained by the active material amount calculation unit 107, and a capacity of the secondary battery 101 obtained by the capacity calculation unit 109.

Figure 13:
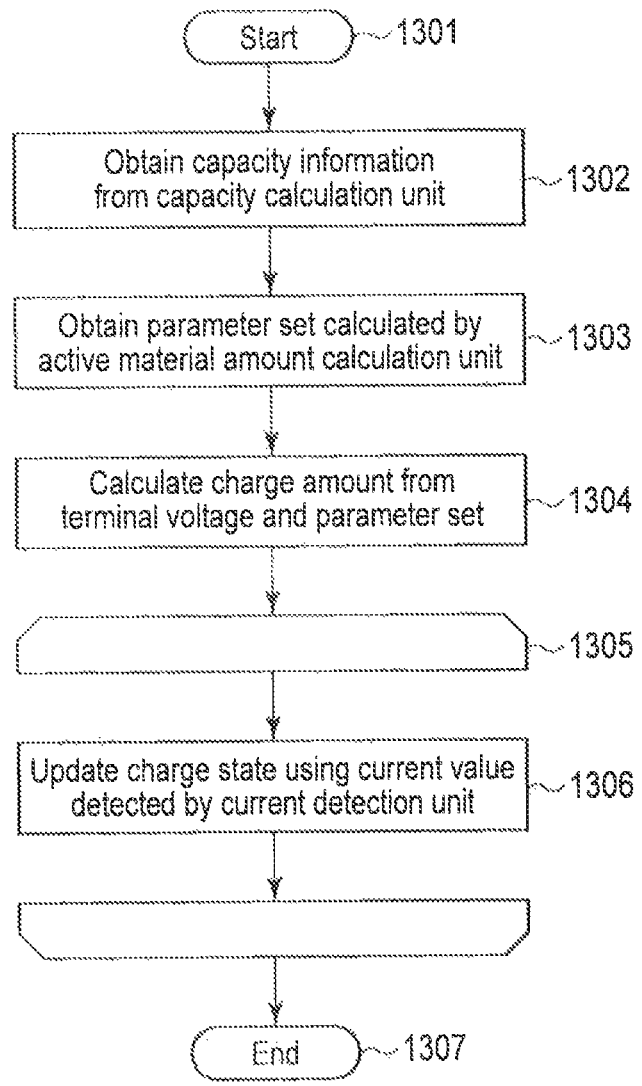
FIG. 13 is a flowchart showing processing of a charge state calculation apparatus according to the second embodiment.

FIG. 13 snows the sequence of processing of the charge state calculation unit 110. The charge state calculation unit 110 starts processing from step 1301. In step 1302, the charge state calculation unit 110 obtains the capacity from the capacity calculation unit 109. In step 1303, the charge state calculation unit 110 obtains a parameter set (the mass raid initial charge amount of the cathode and the mass and initial charge amount of the anode) from the active material amount calculation unit 107.

In step 1304, from the voltage detected by the voltage detection unit 104 and the parameter set obtained in step 1303, the charge state calculation unit 110 calculates an initial value SOC(0) using the function representing the relationship between the charge amount of the secondary battery 101 which is calculated using the capacity calculation unit 109 and the open-circuit voltage calculated using the open circuit potential calculation unit 108. As in the first embodiment, each of the cathode and anode of the secondary battery 101 is made of one kind of active material. The relationship between the charge amount and potential on the charge side is different from that on the discharge side for the anode. A description will be made, assuming that the active material amount of the secondary battery is calculated from the change in voltage at the time of charging.

The function representing the relationship between the charge amount and the open-circuit voltage of the secondary battery 101 is expressed by equation (5). The relationship between the charge amount and potential of the anode, which is changed by the initial charge amount, is calculated using the open-circuit potential calculation unit 108, $$E_n(q') = f_c\left(q_0^c + \frac{q' + q_{n0}}{M_c}\right) - f_a\left(q_0^a + \frac{q' + q_{n0}}{M_a}, q_0^a\right) \quad (5)$$

The charge state (SOC) of the battery is calculated using the voltage detected by the voltage detection unit 104 and equations (6) and (7):

$$q_0 = g(E_{bat}) \quad (6)$$

g( ): the inverse function of the function representing the relationship between the charge amount and the open-circuit voltage $E_{bat}$: the battery terminal voltage in the non-load state $$SOC(0) = \frac{q_0}{FCC} \quad (7)$$

FCC: the capacity calculated by the capacity calculation unit

Processing in step 1306 is repeated in loop 1305 until charging or discharging is complete, thereby continuously updating the charge state.

In step 1306, the charge state calculation unit 110 calculates the charge state SOC(t) at time t by using equation (8), $$SOC(t) = SOC(t-1) + \frac{I_i \Delta t}{FCC} \quad (8)$$

$\Delta t$: the elapsed time from time t−1 to time t

As has been described above, according to the second embodiment, by using the capacity and the relationship between the charge amount and open-circuit voltage of the secondary battery, which is changed over time, the charge state of the secondary battery can be accurately calculated.

The apparatuses of the above-described embodiments can also be realized using, for example, a versatile computer as basic hardware. Namely, the structural elements chat should be incorporated in the information processing terminals and the information management apparatuses can be realized by causing a processor in the computer to execute a program. At this time, the information processing terminals and the information management apparatuses may be realized by beforehand installing the program in the computer, or by storing the program in a recording medium, such as a CD-ROM, or by downloading the program through a network to the computer. Yet alternatively, the program can be realized by appropriately utilizing a recording medium, such as a memory, a hard disk, a CD-R, a CD-RW, a DVD-RAM or a DVDR, installed in or externally attached to the computer.

While certain embodiments have been described, these embodiments have been presented, by way of example only, and are not intended to limit the scope of the inventions. Indeed, the novel apparatuses, methods and computer readable media described herein, may be embodied, in a variety of other forms; furthermore, various omissions, substitutions and changes in the form of the apparatuses, methods and computer readable media described herein may be made without departing from the spirit of the inventions. The accompanying claims and their equivalents are intended to cover such forms or modifications as would fall within the scope and spirit of the inventions.

The invention claimed is:

1. A calculation apparatus comprising:
   a memory configured to store first relationships between charge amounts and open-circuit potentials of a cathode and anode of a secondary battery on a charge side and second relationships between charge amounts and open-circuit potentials of the cathode and anode on a discharge side; and
   a first calculator configured to calculate relationships between charge amounts and open-circuit potentials of the cathode and anode according to arbitrary initial charge amounts of the cathode and anode based on the first relationships and the second relationships stored in the memory.

2. The apparatus according to claim 1, wherein the relationships between the charge amounts and the open-circuit potentials of the cathode and anode according to the arbitrary initial charge amounts of the cathode and anode include second relationships between charge amounts and open-circuit potentials of cathode and anode for charging from zero charge amounts, and third relationships between charge amounts and open-circuit potentials of the cathode and anode for discharging from full charge amounts.

3. The apparatus according to claim 2, wherein the relationships between the charge amounts and the open-circuit potentials of the cathode and anode according to the arbitrary initial charge amounts of the cathode and anode represent a first curve, the second relationships represent a second curve, and the third relationships represent a third curve, the first curve being between the second curve and the third curve.

4. The apparatus according to claim 3, wherein, for each of the cathode and anode, a voltage of a charge amount on the first curve is given by a ratio of a voltage of a charge amount on the second curve to a voltage of a charge amount on the third curve.

5. The apparatus according to claim 1, further comprising a third calculator to calculate a capacity of the secondary battery based on active material amounts of the cathode and anode and the relationships between the charge amounts and the open-circuit potentials of the cathode and anode.

6. A method executed by an information processing apparatus, the method comprising:
   storing in memory first relationships between charge amounts and open-circuit potentials of a cathode and anode of a secondary battery on a charge side and second relationships between charge amounts and open-circuit potentials of the cathode and anode on a discharge side; and
   calculating relationships between charge amounts and open-circuit potentials of the cathode and anode according to arbitrary initial charge amounts of the cathode and anode based on the first relationships and the second relationships stored in the memory.

7. A calculation apparatus comprising:
   a memory to store first relationships between charge amounts and open-circuit potentials of a cathode and anode of a secondary battery;
   a second calculator to perform regression analysis by using the first relationships, a measurement time, a terminal voltage value of the secondary battery determined by a current value of the secondary battery, and time variation of the terminal voltage value and the current value of the secondary battery during the measurement time to calculate active material masses and initial charge amounts of the cathode and anode, and an internal resistance value of the secondary battery, the first relationships being determined for each active material included in the cathode and anode; and
   a first calculator to calculate relationships between charge amounts and open-circuit potentials of the cathode and anode according to arbitrary initial charge amounts of the cathode and anode by performing regression analysis based on the active material mass and the initial charge amounts.

8. The apparatus according to claim 7, the first relationships include second relationships between charge amounts and open-circuit potentials of the cathode and anode for charging from zero charge amounts, and third relationships between charge amounts and open-circuit potentials of the cathode and anode for discharging from full charge amounts.

9. The apparatus according to claim 8, wherein the first relationships represent a first curve, the second relationships represent a second curve, and the third relationships represent a third curve, the first curve being between the second curve and the third curve.

10. The apparatus according to claim 9, wherein, for each of the cathode and anode, a voltage of a charge amount on the first curve is given by a ratio of a voltage of a charge amount on the second curve to a voltage of a charge amount on the third curve.

11. The apparatus according to claim 7, further comprising a third calculator configured to calculate a capacity of the secondary battery based on active material amounts of the cathode and anode and the relationships between the charge amounts and the open-circuit potentials of the cathode and anode.

12. A method executed by an information processing apparatus, the method comprising:
   storing in memory first relationships between charge amounts and open-circuit potentials of a cathode and anode of a secondary battery;
   performing regression analysis by using the first relationships, a measurement time, a terminal voltage value of the secondary battery determined by a current value of the secondary battery, and time variation of the terminal voltage value and the current value of the secondary battery during the measurement time to calculate active material masses and initial charge amounts of the cathode and anode, an active material mass and an initial charge amount of the cathode, and an internal resistance value of the secondary battery, the first relationships being determined for each active material included in the cathode and anode; and
   calculating relationships between charge amounts and open-circuit potentials of the cathode and anode according to arbitrary initial charge amounts of the cathode and anode by performing regression analysis based on the active material mass and the initial charge amounts.

13. A non-transitory computer readable medium storing a computer program which is executed by a computer to provide the steps of:
   storing in memory first relationships between charge amounts and open-circuit potentials of a cathode and anode of a secondary battery on a charge side and second relationships between charge amounts and open-circuit potentials of the cathode and anode on a discharge side; and calculating relationships between charge amounts and open-circuit potentials of the cathode and anode according to arbitrary initial charge amounts of the cathode and anode based on the first relationships and the second relationships stored in the memory.

14. A non-transitory computer readable medium storing a computer program which is executed by a computer to provide the steps of:

storing in memory first relationships between charge amounts and open-circuit potentials of a cathode and anode of a secondary battery;

performing regression analysis by using the first relationships, a measurement time, a terminal voltage value of the secondary battery determined by a current value of the secondary battery, and time variation of the terminal voltage value and the current value of the secondary battery during the measurement time to calculate active material masses and initial charge amounts of the cathode and anode, an active material mass and an initial charge amount of the cathode, and an internal resistance value of the secondary battery, the first relationships being determined for each active material included in the cathode and anode; and calculating relationships between charge amounts and open-circuit potentials of the cathode and anode according to arbitrary initial charge amounts of the cathode and anode by performing regression analysis based on the active material mass and the initial charge amounts.

* * * * *